United States Patent
Krebs et al.

(10) Patent No.: US 8,399,795 B2
(45) Date of Patent: Mar. 19, 2013

(54) ENHANCING PLASMA SURFACE MODIFICATION USING HIGH INTENSITY AND HIGH POWER ULTRASONIC ACOUSTIC WAVES

(75) Inventors: Niels Krebs, Hellerup (DK); Alexander Bardenshtein, Hedehusene (DK); Yukihiro Kusano, Roskilde (DK); Henrik Bindslev, Charlottenlund (DK); Henrik Junge Mortensen, Taastrup (DK)

(73) Assignees: Force Technology, Brondby (DK); Technical University of Denmark, Kgs. Lyngby (DK)

( * ) Notice: Subject to any disclaimer, the term of this patent is extended or adjusted under 35 U.S.C. 154(b) by 767 days.

(21) Appl. No.: 12/599,775
(22) PCT Filed: May 9, 2008
(86) PCT No.: PCT/EP2008/055773
   § 371 (c)(1),
   (2), (4) Date: Nov. 11, 2009
(87) PCT Pub. No.: WO2008/138901
   PCT Pub. Date: Nov. 20, 2008

(65) Prior Publication Data
   US 2010/0304146 A1    Dec. 2, 2010

(30) Foreign Application Priority Data
   May 11, 2007  (DK) ................................. 2007 00717

(51) Int. Cl.
   *H05H 1/24*    (2006.01)
   *B08B 6/00*    (2006.01)
   *H05F 3/00*    (2006.01)
   *A61F 2/00*    (2006.01)
   *C23F 1/00*    (2006.01)
(52) U.S. Cl. ..................................... 219/121.36; 216/67
(58) Field of Classification Search ............... 219/121.4, 219/121.43, 121.44; 315/111.21, 111.41, 315/111.51, 111.71; 204/298.38, 298.39; 216/67, 69; 156/345.41, 345.43, 345.48, 345.52; 118/723 R, 723 MW
See application file for complete search history.

(56) References Cited

U.S. PATENT DOCUMENTS
3,169,507 A * 2/1965 Rich ......................... 116/137 R
5,367,139 A * 11/1994 Bennett et al. ........... 219/121.59
(Continued)

FOREIGN PATENT DOCUMENTS
JP   7060211    3/1995
JP   11335869   12/1999
(Continued)

OTHER PUBLICATIONS

Kwang-Seok Choi et al. "Improvement of Charging Performance of Corona Charger in Electrophotography by Irradiating Ultrasonic Wave to Surrounding Region of Corona Electrode", Japanese Journal of Applied Physics, vol. 44, No. 5A, 2005, pp. 3248-3252.

*Primary Examiner* — Long Tran
*Assistant Examiner* — Jordan Klein
(74) *Attorney, Agent, or Firm* — Morrison & Foerster LLP

(57) ABSTRACT

This invention relates to a plasma surface modification process (and a corresponding a system) of a solid object (100) comprising creating plasma (104) by a plasma source (106), application of the plasma (104) to at least a part of a surface (314) of the solid object (100), generating ultrasonic high intensity and high power acoustic waves (102) by at least one ultrasonic high intensity and high power acoustic wave generator (101), wherein the ultrasonic acoustic waves are directed to propagate towards said surface (314) of the object (100) so that a laminar boundary layer (313) of a gas or a mixture of gases (500) flow in contact with said solid object (100) is thinned or destructed for at least a part of said surface (314). In this way, the plasma can more efficiently access and influence the surface of the solid object to be treated by the plasma, which speeds the process time up significantly.

29 Claims, 9 Drawing Sheets

U.S. PATENT DOCUMENTS

| | | | | |
|---|---|---|---|---|
| 5,387,777 | A | * | 2/1995 | Bennett et al. ............ 219/121.43 |
| 5,457,847 | A | * | 10/1995 | Uzawa et al. .................... 15/345 |
| 6,261,373 | B1 | * | 7/2001 | Grant ............................ 118/725 |
| 6,383,301 | B1 | * | 5/2002 | Bell et al. ...................... 118/716 |
| 6,554,969 | B1 | * | 4/2003 | Chong ..................... 204/192.12 |
| 6,949,716 | B2 | * | 9/2005 | Koulik et al. ............. 219/121.59 |
| 2001/0029964 | A1 | * | 10/2001 | Fujii et al. ......................... 134/1 |
| 2002/0182101 | A1 | * | 12/2002 | Koulik et al. .................... 422/4 |
| 2003/0165636 | A1 | * | 9/2003 | Koulik et al. ................ 427/569 |
| 2004/0105779 | A1 | * | 6/2004 | Krebs ............................. 422/26 |
| 2007/0065596 | A1 | * | 3/2007 | Koulik et al. ................. 427/535 |
| 2009/0288910 | A1 | * | 11/2009 | Krebs et al. ................... 181/175 |

FOREIGN PATENT DOCUMENTS

| | | |
|---|---|---|
| JP | 2000040689 | 2/2000 |
| JP | 2006013903 | 1/2006 |
| WO | 02078751 | 10/2002 |
| WO | 2008003324 | 1/2008 |

* cited by examiner

ENHANCING PLASMA SURFACE MODIFICATION USING HIGH INTENSITY AND HIGH POWER ULTRASONIC ACOUSTIC WAVES

FIELD OF THE INVENTION

The invention relates to a method of plasma surface modification of an object. The invention further relates to a system for plasma surface modification of an object and an object that has had its surface modified by plasma surface modification.

BACKGROUND OF THE INVENTION

Plasma is an ionized gas. Active species of ions, electrons, high-energy neutrals, radicals as well as ultra-violet emission in plasmas can be used for modification of material surfaces such as surface activation/inactivation, adhesion improvement, wettability enhancement, printability improvement, surface cleaning, hardening, cross-linking, curing, polymer-chain secession, coloration, roughening, ashing, etching, sterilization, thin film deposition, material synthesis (particle formation at the surface etc.) etc.

Plasma surface modification can usually be divided into two categories with opposite effects, depending mainly on the process gas(es) used. The first one mainly ablates the surfaces, and is usually called "plasma treatment", "plasma surface modification", "plasma ablation" (R Li et al. Composites Pt.A 28A (1997) 73-86), or "non-polymer-forming plasma" (N Dilsiz J Adhesion Sci. Technol. 14(7) (2000) 975-987). The second one is usually called "plasma polymerization", "polymer-forming plasma" (N Dilsiz J Adhesion Sci. Technol. 14(7) (2000) 975-987) or plasma enhanced chemical vapour deposition (PECVD). In the following "plasma surface modification" is meant to cover both types while "plasma treatment" is used for the first one and "plasma polymerization" is used for the second one.

If the used gas(es) has high proportions of carbon and hydrogen atoms, double- or triple-bonds in its composition such as methane, ethylene, acetylene and ethanol, or if they are precursors such as metal-organic (organometallic) gas (es), the plasma often results in plasma polymerization or PECVD. Here, metal-organic gases are those which contain a metal, particularly compounds in which the metal atom has a direct bond with a carbon atom. Otherwise, the plasma will have a tendency of ablation (plasma treatment).

A variety of plasmas exists, including direct current plasmas, capacitively coupled plasmas, pulsed plasmas, magnetron plasmas, electron cyclotron resonance plasmas, inductively coupled plasmas, helicon plasmas, helical resonator plasmas, microwave plasmas, and plasma jets (see e.g. A Bogaerts et al. Spectrochimica Pt.B 57 (2002) 609-658.). Many of them are operated at low pressures, suffering from the drawbacks that they require expensive vacuum systems. Furthermore, methods are only well-developed for batch or semi-batch treatments. To overcome these drawbacks an atmospheric pressure plasma surface modification system can be used that not only avoids the need for vacuum equipment but also permits both the surface modification of large objects and production line continuous surface modification (see e.g. C Tendero et al. Spectrochimica Pt.B 61 (2006) 2-30.).

A prior art plasma application system is shown in FIG. 1 and is explained in more detail in the following. FIG. 1 illustrates an example of capacitively coupled plasma of the well-known so-called dielectric barrier discharge (DBD) type usable at atmospheric pressure.

Other types or variations of plasma sources include dielectric barrier discharges (DBDs) with a single dielectric barrier located substantially in the middle between the two electrodes or with a single dielectric barrier covering only one of the electrodes. Such plasma sources are typically also referred to as volume discharge (VD) sources where a microdischarge can take place in thin channels generally randomly distributed over the electrode- and/or dielectric-surface. Other DBD plasma sources include so-called surface discharge (SD) plasma sources typically comprising a number of surface electrodes on a dielectric layer and a counter-electrode on the reverse side of the dielectric layer. Such SD plasma sources may include a so-called SPCP (Surface-discharge-induced Plasma Chemical Processing) discharge element or CDSD (Coplanar Diffuse Surface Discharge) element. In a SPCP, electrodes are attached on the dielectric(s) and in a CDSD the electrodes are embedded in the dielectric(s).

Other types of plasma sources are e.g. so-called plasma torches such as arc plasma torches, cold plasma torches (see e.g. H Mortensen et al. Jpn. J Appl. Phys. 45(10B) (2006) 8506-8511.), atmospheric pressure plasma jet (APPJ), pencil like torches, barrier torches, and microwave torches (see e.g. C Tendero et al. Spectrochimica Pt.B 61 (2006) 2-30.). Yet another type of plasma source is the so-called gliding arc (see for example A Fridman et al. J. Phys. D Appl. Phys. 38 (2005) R1-R24).

Additional types of plasma sources are low pressure plasmas, corona discharge (see e.g. A Bogaerts et al. Spectrochimica Pt.B 57 (2002) 609-658) and microplasmas (see e.g. V Karanassios Specrochimica Acta Pt.B 59 (2003) 909-928). See e.g. A Bogaerts et al. Spectrochimica Pt.B 57 (2002) 609-658, U Kogelschatz Plasma Chem. Plasma Proc. 23(1) (2003) 1-46, C Tendero et al. Spectrochimica Pt.B 61 (2006) 2-30 and A Fridman et al. J. Phys. D Appl. Phys. 38 (2005) R1-R24) for further details of plasmas and atmospheric pressure plasmas.

The two articles 'Ozone generation by hollow-needle to plate electrical in an ultrasound field', J. Phys. D: Appl. Phys. 37 (2004) 1214-1220 and 'Ultrasound and airflow induced thermal instability suppression of DC corona discharge: an experimental study', Plasma Sources Sci. Technol. 15 (2006) 52-58 by Stanislav Pekárek and Rudolf Bálek disclose suppression of DC corona discharge where ultrasound or ultrasound combined with an airflow is used in connection with a hollow needle-to-plate electrode system to activate the corona discharge for ozone production. The article 'Improvement of Charging Performance of Corona Charger in Electrophotography by Irradiating Ultrasonic Wave to Surrounding Region of Corona Electrode' (Kwang-Seok Choi, Satoshi Nakamura and Yuji Murata Jpn. J. Appl. Phys. 44(5A) (2005) 3248-3252.) discloses improvement of the charging speed of a corona charger in electrophotography using an ultrasonic wave where the ultrasonic wave increases the charge density on an insulator layer of a coated aluminum drum used instead of a photoreceptor drum used for printing. At least some of the findings in the articles have also been disclosed in patent application CZ 295687.

The ultrasonic generators disclosed in three above-mentioned articles are based on piezoelectric transducers. No mention is given of specific or preferred sound pressure levels of the emitted acoustic waves or ultrasonic waves or the advantages thereof.

Furthermore, the two first articles mention that the acoustic pressures developed by ultrasonic layouts are, respectively, of the order of 2 and 10 kPa near the emitting surface of the transducer at the frequency of generated ultrasound of 20.3 kHz. In the third article, the ultrasonic generator is a 28-kHz 50-mm-diam and 80-mm-height bolt-clamped Langevin-type piezoelectric transducer. The maximum input power is 50 W. These values give an estimation of the emitted acoustic pressure value to be approximately 2 kPa. The pressure values of 2 and 10 kPa correspond to very high sound pressure levels of 160 and 174 dB above the reference pressure of $2 \times 10^{-5}$ Pa. It can be estimated that the above-specified acoustic pressures at the above frequency correspond to ultrasound intensities of 4.4 and 20 kW/m$^2$ or the sound intensity levels of 156 and 163 dB above the reference intensity of 1 pW/m$^2$.

This characterizes the ultrasonic acoustic waves being applied in these three articles as high-intensity.

However, the acoustic power provided according to all three articles is in fact too low and too localized to allow for uniform minimization and/or elimination of a laminar boundary layer over a relatively substantial area of an object to have its surface modified by plasma.

The similar situation can be outlined regarding the patent specification U.S. Pat. No. 6,391,118. It discloses a method for removing particles from the surface of an article in an apparatus using corona discharge. The particles are supplied with an electric charge and subsequently an ultrasonic wave or gas stream is applied onto the surface of the article while an electric field is applied for driving away the electrically charged solid particles from the surface. The application of an ultrasonic wave and/or gas further facilitate the removal of the electrically charged solid particles. The variety of ultrasonic generators (oscillators) here includes a piezoelectric oscillator, a polymer piezoelectric membrane, an electrostrictive oscillator, a Langevin oscillator (that is as mentioned above just a special type of piezoelectric transducers), a magnetostrictive oscillator, an electrodynamic transformer, and a capacitor transformer. Use of such oscillators provides acoustic power that is low (no more than 50 W) and localized. It is too low and localized to allow for uniform minimization and/or elimination of a laminar boundary layer over a relatively substantial area of an object to have its surface modified by plasma. Moreover, no disclosure is given of a specific or preferred sound pressure level of the emitted ultrasonic waves or the advantages thereof. Furthermore, plasma surface modification is not addressed in this specification.

Additionally, no mention or discussion of a laminar boundary layer around the object to be modified is given. The presence of this boundary laminar layer hinders the excess of energetic plasma particles (and hence the mass and energy transfer) to the surface of the object and thereby reduces the efficiency of the plasma treatment. It is important to eliminate or reduce the laminar boundary layer substantially uniformly over a substantial area of the object to be modified by plasma.

Patent application US 2003/0165636 discloses a process for atmospheric pressure plasma surface modification of an object's surface where excitation of the surface to be treated is done so that it vibrates and undulates thereby activating the application of plasma. The energy for excitation of the surface may come from the process of creating the plasma, from an external source, or from a combination thereof. The energy for excitation of the surface may come from a vibration generator brought in contact with the object to be treated or by indirect contact from a vibration generator emitting acoustic waves, e.g. ultrasonic waves, to the object to be treated so that it provokes turbulent plasma. No disclosure is given of a specific or preferred sound pressure level of the acoustic waves or the ultrasonic waves or the advantages thereof. Therefore, exciting surface vibrations and undulations, or in other words, generation of guided and surface acoustic waves on the object is suggested in order to intensify a plasma treatment. Correspondingly, it is disclosed that the vibration of the surface to be treated can be the result of excitation at one or several eigenfrequencies and their harmonics associated with the body of the object to be treated. Thus, either the range of the characteristic dimension of the modified object (primarily its thickness) is strictly limited by the operating frequency of the used source of acoustic energy, or the said frequency is strictly determined by the dimension of the object. It is also disclosed that the vibration of the surface can also result from forced frequencies when an external generator of acoustic waves emits frequencies that are not harmonics of the eigenfrequencies of the object to be treated. This signifies generation of surface acoustic waves (primarily the Rayleigh surface waves).

The following procedures of transfer of acoustic power into ambient gas/plasma are mentioned:
1. External acoustic generator→Treated object surface vibration→Gas molecules (plasma particles) vibration.
2. Generation of the treated surface object vibration directly, for instance through a direct acoustic contact→Gas molecules (plasma particles) vibration.

Both procedures require acoustic waves to overpass the solid/gas interface at least once. However, due to more than four-orders-of-magnitude difference in acoustic impedance for a solid and a gas, most of generated acoustic power cannot be emitted (and especially re-emitted) into the gas atmosphere and remains in a solid being ultimately converted into thermal energy. Thus, it is not possible in this way to generate sound or ultrasound in the air with a power that would be enough to remove or reduce the laminar boundary layer on sufficiently large surfaces. Moreover, no mention or discussion of a laminar boundary layer near to the surface of the object to be modified is given. The presence of this boundary laminar layer hinders the access of energetic plasma particles (and hence the mass and energy transfer) to the surface of the object and thereby reduces the efficiency of the plasma treatment. Therefore, it is of prime importance not simply to "shake" the surface up and provoke uncontrolled turbulent plasma with unknown efficiency and spatial distribution in such a way, but rather to eliminate or reduce the boundary laminar layer directly, efficiently, and substantially uniformly over a substantial area of the object to be modified by plasma.

Patent specification CN 1560316 discloses a process for ultrasonic plasma-spraying for controlling coating porosity and improving coating bond strength where an ultrasonic excitation source is connected in parallel with an anode and a cathode of the spray gun of the plasma-spraying device and where the sprayed powder is heated and the ultrasound acts on the plasma and simultaneously on the melting sprayed powder. No mention or discussion of a boundary laminar layer over the surface of the object to be modified is given. The presence of this boundary laminar layer hinders the access of energetic plasma particles (and hence the mass and energy transfer) to the surface of the object and thereby reduces the efficiency of the plasma surface modification.

The generated acoustic power is relatively low (at any rate, below 100 W) because the power applied to the acoustic wave transmitter is actually 100 W, and the efficiency of sound generation in a gas atmosphere cannot exceed ~30% even for the most effective gas-jet ultrasonic transmitters, not to mention other methods. This is too low power to efficiently allow for substantial uniform minimization and/or elimination of the laminar boundary layer over a substantial area of an object to have its surface modified by plasma.

Patent application JP 11335869 A discloses a process for surface treatment and a device therefore where activated species in gas form is generated in a plasma and where the activated species in gas form is subjected to ultrasound and brought in contact with a surface. So a surface treatment by a gas and not surface treatment by a plasma is disclosed.

A principal impediment to the transfer or transmission of energy and/or mass from a plasma to a solid surface is the laminar boundary layer between the plasma and the object to be treated, which adheres to the solid surface. Even when the motion of the gas is fully turbulent, a laminar boundary layer exists (as explained in greater detail in connection with FIGS. 3a and 3b) that obstructs mass transport and/or energy transfer. While various methods and types of apparatus have been suggested for overcoming the problem such as by means of driving the plasma with sonic waves and vibrating the solid object with external vibration generators, these methods while being effective to some extent, are inherently limited in their ability to generate an effective minimization of the laminar boundary layer and at the same time covering an area large enough to make the method efficient.

None of the mentioned prior art disclosures specify an acoustic power level sufficient to efficiently allow for substantial uniform minimization and/or elimination of the laminar boundary layer over a substantial area of an object to have its surface modified efficiently by plasma. Furthermore, the prior art involving piezoelectric transducers or other transducers involving a solid to transfer the energy, only provides the energy in a very localized fashion, e.g. very close to the piezoelectric transducer (or other solid transducer) and is therefore unsuitable for uniform surface modification.

SUMMARY OF THE INVENTION

It is an object of the invention to provide a method of and a device for plasma surface modification that alleviates the above-mentioned shortcomings of prior art at least to an extent.

It is another object to enable enhancement of a plasma surface modification of a solid object or specimen.

It is yet another object to enable plasma to more efficiently immerse and influence a surface of a solid object or specimen.

An additional object is to speed the process of plasma surface modification of an object up.

These objectives are obtained at least to an extent by a method of plasma surface modification of a solid object comprising: creating plasma by at least one plasma source, and application of the plasma to at least a part of a surface of the solid object, wherein the method further comprises: generating ultrasonic high intensity and high power acoustic waves by at least one ultrasonic high intensity and high power gas-jet acoustic wave generator, where said ultrasonic high intensity and high power acoustic waves are directed to propagate towards said surface of the object so that a laminar boundary layer of a gas or a mixture of gases in contact with said solid object is removed or minimized for at least a part of said surface, and where a sound pressure level of said generated ultrasonic high intensity and high power acoustic waves is at least substantially 140 dB and where an acoustic power of said generated ultrasonic high intensity and high power acoustic waves is at least substantially 100 W.

In this way, a high sound intensity and power are obtained that efficiently allows for substantial uniform minimization and/or elimination over a substantial area of an object to have its surface modified by plasma, since a gas-jet acoustic wave generator is capable of delivering sufficiently high sound intensity and power.

As a comparison, the sound-emitting surface area of transducers, e.g. like the ones described in the previous mentioned prior art articles ('Ozone generation by hollow-needle to plate electrical in an ultrasound field'; 'Ultrasound and airflow induced thermal instability suppression of DC corona discharge: an experimental study'; and 'Improvement of Charging Performance of Corona Charger in Electrophotography by Irradiating Ultrasonic Wave to Surrounding Region of Corona Electrode') is of the order of $2 \times 10^{-3}$ m$^2$ and the emitted acoustic power is 10-40 W.

The acoustic power provided by a high-power gas-jet generator is capable of much higher acoustic power outputs along with the high sound pressure and intensity levels of 140 or 150 to 170 dB (see e.g. Y. Y. Borisov, Acoustic gas-jet generators of Hartmann type, in L. D. Rozenberg (ed.) Sources of High-Intensity Ultrasound (New York: Plenum: 1969) part I. and Levavasseur, R. High power generators of sound and ultrasound. US Patent, book 116-137, U.S. Pat. No. 2,755,767 (1956).).

It has been shown that an acoustic power of about 100 W or more enhances plasma surface modification of an object.

A high-power gas-jet generator is normally capable of an acoustic power of several hundreds watts (i.e. approximately one order of magnitude higher than the piezoelectric transducer acoustic power output) and typical SPL (sound pressure level) of 160 dB at 10 cm from the generator orifice at the frequency of 20-30 kHz. Even an acoustic power of 1-2 kW is attainable.

The main physical reason for such a dramatic difference in acoustic power outputs of piezoelectric (or other solid-state acoustic transducers) and gas-jet generators is that a piezoelectric transducer works by vibrating (using sound) a solid being in contact with a gas and thus transfers the vibrations to the gas. Due to the tremendous difference in acoustic impedance for a solid and a gas (a so-called acoustic impedance mismatch), most of generated acoustic power cannot be emitted in the ambient gas and remains in a solid. It is converted into thermal energy and results in a transducer warming-up.

Consequently, it is not possible in this way to generate sound or ultrasound in the gas with a power that would be enough to remove or reduce the laminar boundary layer of a plasma flow on sufficiently large surfaces. In fact, a single piezoelectric transducer provides the high-intensity ultrasound radiation only nearby its emitting surface and irradiates a limited surface area that is comparable with the area of its emitting surface. That is because of the acoustic wave diffraction, which is significant when the transducer diameter is comparable with the acoustic wavelength. Indeed, for ultrasound frequency of 20-30 kHz in the air the wavelength is about 10-20 mm that is of the order of the actual transducer diameter. In the case of gas-jet ultrasonic transmitters, a vibrating media is not a solid but a gas. It is clear that there is no any impedance mismatch and high enough acoustic power can be emitted in the ambient gas. Moreover, intensity and sound pressure levels of ultrasound radiation remain very high at several tens of centimeters from the gas-jet transmitter orifice while the acoustic wave front is broad (it is sometimes just a spherical wave front). In this way, it is possible to expose large surfaces to high-intensity ultrasound (sound intensity and sound pressure levels of substantially 140 dB and above at approximately 10 cm from the generator's orifice) and remove or reduce the laminar boundary layer of a gas or that of plasma flow over large surfaces efficiently thereby enhancing the plasma surface modification.

In this way, the ultrasonic high intensity and high power acoustic waves remove or minimize a laminar boundary layer surrounding the solid object as explained in greater detail in the following and in particular in connection with FIGS. 3a and 3b. It has been shown that such a laminar boundary layer of a plasma flow also hinders plasma surface modification of a solid object.

The thinning or destruction of the laminar boundary layer enables the plasma particles to more efficiently be able to access and influence the surface of the solid object to be treated by the plasma.

This will allow for faster plasma surface modification processes.

Reducing the time needed for plasma surface modification of one or more objects reduces the cost of the process since the process is expensive and requires a lot of energy.

Furthermore, the shorter the time that an object is subjected to plasma surface modification, the lesser the risk is to spoil or degrade important physical or chemical characteristics (e.g. localized overheating and cracking, burnout, heat and electrical aging, discoloration etc.) of the treated object.

The use of a gas-jet generator also avoids that the surface of the object to be modified by plasma has its surface vibrated substantially.

In some embodiments, the solid object(s) may be covered (fully or partly) by a layer of a liquid or fluid during the plasma surface modification.

In one embodiment, the acoustic pressure level of said generated ultrasonic high intensity and high power acoustic waves is
  at least substantially 150 dB,
  at least substantially 160 dB,
  at least substantially 170 dB,
  at least substantially 180 dB,
  at least substantially 190 dB, or
  at least substantially 200 dB.
  where the sound pressure level as they are at 10 cm from the generator orifice.

In one embodiment, the acoustic power of said generated ultrasonic high intensity and high power acoustic waves is
  at least substantially 200 W,
  at least substantially 300 W,
  at least substantially 400 W,
  about 400 W,
  greater than substantially 400 W,
  at least substantially 500 W,
  at least substantially 1 kW, or
  selected from about 1-2 kW.

It is to be understood, that if several acoustic generators are used even higher powers may be obtained.

In one embodiment, the plasma source comprises at least one source selected from a group of: a dielectric barrier discharge (DBD) plasma source, a surface discharge (SD) plasma source, a volume discharge (VD) plasma source, a plasma torch source, an arc plasma torch, a gliding arc plasma torch, a cold plasma torch, a pencil-like torch, a direct current plasma source, a capacitively coupled plasma source, a pulsed plasma source, a magnetron plasma source, an electron cyclotron resonance plasma source, an inductively coupled plasma source, a helicon plasma source, a helical resonator plasma source, a microwave plasma source, an atmospheric pressure plasma jet (APPJ) source, a barrier torch, an arc microwave torch, a corona discharge plasma source, a micro-plasma source, a low pressure plasma source, and a high pressure plasma source.

In one embodiment, a working gas pressure at an inlet of the at least one ultrasonic high intensity and high power gas-jet acoustic wave generator is between approximately 1.9 and approximately 5 bar.

In one embodiment, the plasma is created at atmospheric pressure.

In one embodiment, the plasma source comprises at least one electrode and wherein one electrode of said at least one electrode is a mesh type of electrode.

This allows the gas/energy to pass through the 'upper' electrode in a very simple and efficient way.

In one embodiment, the generated ultrasonic high intensity and high power acoustic waves are propagated towards a membrane so that any gases used by the at least one ultrasonic high intensity and high power acoustic wave generator is not mixed with one or more gases used by said plasma source to create said plasma.

In one embodiment, the generated ultrasonic high intensity and high power acoustic waves are generated using a gaseous medium and where the acoustic waves are directed towards said surface of the object and wherein said gaseous medium after exit of said at least one ultrasonic high intensity and high power gas-jet acoustic wave generator is directed away from said surface of the object.

In one embodiment, the generated ultrasonic high intensity and high power acoustic waves do not spatially overlap with the working gas flow outgoing from the generator orifice. Moreover, since the generated ultrasonic high intensity and high power acoustic waves are directed toward the treated surface and the gas outgoing from the ultrasonic high intensity and high power acoustic wave generator do not overlap in space, the said outgoing working gas is not mixed with one or more gases used by said plasma source to create said plasma.

In these ways, control of the gas environment for the plasma generation process is enabled.

In one embodiment, a gas mixture, that is used for creating the plasma, is supplied to at least one electrode of the plasma source substantially in a direction that said ultrasonic acoustic waves propagate towards said surface of the object.

In one embodiment, the at least one ultrasonic high intensity and high power gas-jet acoustic wave generator is selected from the group of:
  a Hartmann type gas-jet generator,
  a Levavasseur type gas-jet generator,
  a generator comprising an outer part and an inner part defining a passage, an opening, and a cavity provided in the inner part, where said ultrasonic high intensity and high power gas-jet acoustic wave generator is adapted to receive a pressurized gas and pass the pressurized gas to said opening, from which the pressurized gas is discharged in a jet towards the cavity,
  a generator of any of the above mentioned types, which includes any type of concentrators or reflectors of acoustic waves In one embodiment, the solid object is food item, and the method further comprises applying steam to the food item so that the food item is subjected to steam and plasma causing a sterilization process of the food item.

In one embodiment, the generating ultrasonic high intensity and high power acoustic waves comprises:
  generating high intensity and high power acoustic waves by a first acoustic wave generator using a gaseous medium where the gaseous medium, after exit from the first acoustic wave generator, has a first principal direction that is different from a second principal direction of the high intensity and high power acoustic waves generated by the first acoustic wave generator,
  generating high intensity and high power acoustic waves by a second acoustic wave generator,
  where the first and second acoustic wave generators are located in relation to each other so that at least a part of the generated high intensity acoustic waves, being generated by said second acoustic wave generator, is directed towards at least a part of the gaseous medium after exit from said first acoustic wave generator.

In one embodiment, the plasma surface modification of a solid object is selected from the group of:
surface activation and/or inactivation,
adhesion improvement,
wettability enhancement,
printability improvement,
surface cleaning,
hardening,
cross-linking,
curing,
polymer-chain secession,
coloration,
roughening,
ashing,
etching,
sterilization,
thin film deposition,
material synthesis, and
particle formation at the surface.

The present invention also relates to a system corresponding to the method of the present invention. More specifically, the invention relates to a system for plasma surface modification of a solid object comprising: at least one plasma source adapted to create plasma applied to at least a part of a surface of the solid object, wherein the system further comprises: at least one ultrasonic high intensity and high power gas-jet acoustic wave generator adapted to generate ultrasonic high intensity and high power acoustic waves being directed to propagate towards said surface of the solid object so that a laminar boundary layer of a gas or a mixture of gases in contact with said solid object is removed or minimized for at least a part of said surface, and where a sound pressure level of said generated ultrasonic high intensity and high power acoustic waves is at least substantially 140 dB and where an acoustic power of said generated ultrasonic high intensity and high power acoustic waves is at least 100 W.

The present invention also relates to a solid object having a surface being treated by plasma wherein the solid object have been treated with a method according to any embodiment of the present invention.

Advantageous embodiments of the system are defined in the sub-claims and are described in detail in the following. The embodiments of the system correspond to the embodiments of the method and have the same advantages for the same reasons.

BRIEF DESCRIPTION OF THE DRAWINGS

These and other aspects of the invention will be apparent from and elucidated with reference to the illustrative embodiments shown in the drawings, in which.

Throughout the figures, same reference numerals indicate similar or corresponding features.

DESCRIPTION OF PREFERRED EMBODIMENTS

Figure 1:
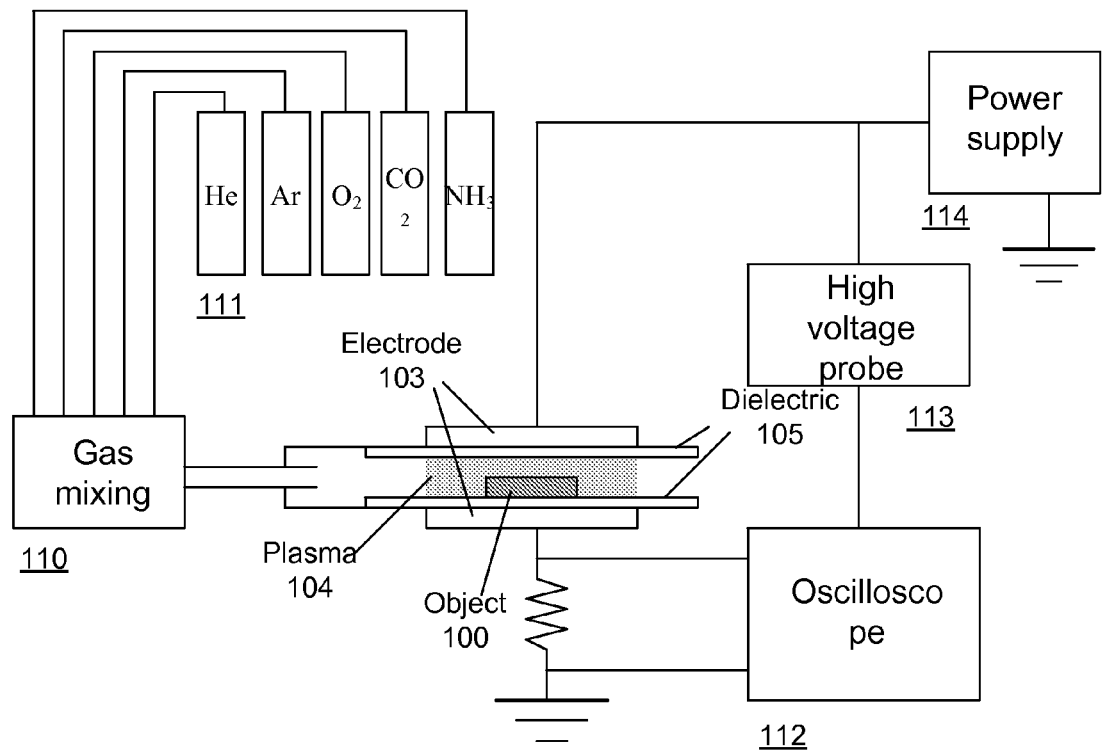
FIG. 1 schematically illustrates a prior art plasma surface modification apparatus.

FIG. 1 schematically illustrates a prior art plasma surface modification apparatus. Shown is an example of a plasma generator or plasma source, i.e. any device or method capable of creating a plasma (forth only denoted plasma source) of the well-known so-called dielectric barrier discharge (DBD) type usable even at atmospheric pressure. Shown are a number of gases (111), such as He, Ar, $O_2$, $CO_2$, and $NH_3$ supplied to a gas mixing unit (110) mixing the gases into a proper composition for the given use or application. The selected gases for the plasma should be selected based on the type of surface modification and may be any gas, which is ordinarily used for known plasma surface modifications and/or the like. Specific and typical examples include He, Ar, Ne, Xe, air, $N_2$, $O_2$, $H_2O$, $CO_2$, halogen compound gases such as Freon gases ($CF_4$, $CHF_3$, $C_3F_6$, $C_4F_8$ etc.), halon gases, $NH_3$, $NF_3$, $SF_6$, organic compound gases ($CH_4$, $C_2H_6$, $C_2H_4$, $C_2H_2$, $C_6H_6$, $C_2H_5OH$, etc.), NOx, $SO_2$, silanes etc. and gas mixtures selected from them. In order to stabilize the plasma, the gas(es) can be diluted with He, Ar, see e.g. European patent EP 0508833 B1.

Further shown are two electrodes (103) placed apart with a discharge gap between them, where at least one of the electrodes (103) is adjoined or covered with an insulating or dielectric material (105) on a side of the electrode facing the other electrode in order to avoid arcing. In the figure, both electrodes (103) are adjoined or covered with dielectric material (105). One electrode (103) is connected to a suitable power supply (114) supplying AC high voltage, e.g. 0.1 kHz-500 kHz, between the electrodes (103).

Further, shown are a high voltage probe (113) connected to the power supply (114) and an oscilloscope connected to the high voltage probe (113). The high voltage probe is used for monitoring the applied voltage, but is not relevant for and does not influence the surface modification.

The gas mix is supplied from the gas-mixing unit (110) to the discharge area between the two electrodes (103) and, as a result, plasma (104) is created when voltage is applied to the electrodes (103). A specimen or object (100) is located in the plasma (104) for surface modification, treatment, processing, etc. (forth only denoted surface modification).

Typical examples of surface modifications are e.g. surface cleaning, etching, ashing, surface activation/inactivation, adhesion improvement, preparation of hydrophilic and hydrophobic surfaces, sterilization, thin film deposition, biocompatibility.

A surface modification of an object (100) can be enhanced as shown and explained in the following.

Figure 2:
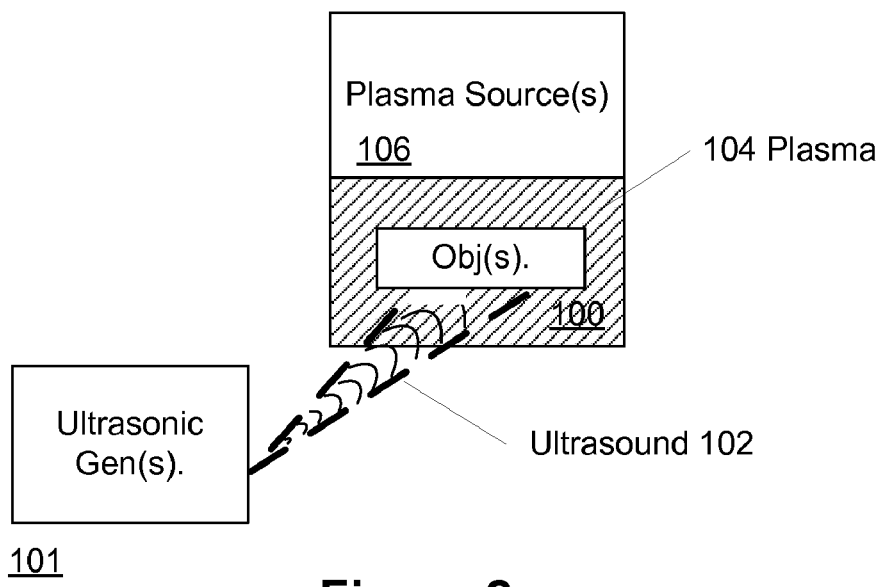
FIG. 2 schematically illustrates a block diagram of a plasma surface modification apparatus.

FIG. 2 schematically illustrates a block diagram of a plasma surface modification process/apparatus. Illustrated are one or more plasma sources (106) creating or supplying plasma (104) and one or more solid objects (100) located in or in contact with the plasma (104) whereby the plasma (104) will treat or modify the surface of the one or more solid objects (100).

Further illustrated are one or more ultrasonic high intensity and high power acoustic wave generators (101) generating high intensity and high power ultrasound (102). According to the present invention, the generated ultrasound (102) is applied to at least a part of the surface of the one or more solid objects (100).

Patent application WO 2006/015604 A1, by one of the applicants, discloses a method and device for enhancing a process involving a gas and a solid object where ultrasound is used to remove or minimize a boundary laminar layer. No disclosure of the process being a plasma surface modification, plasma-related process, or a surface treatment of an object is given.

However, it has surprisingly been shown that the application of high intensity and high power ultrasonic acoustic waves also work for enhancing a plasma surface modification of an object.

By applying high intensity and high power ultrasonic acoustic waves to one or more solid objects being subjected to plasma surface modification, the plasma surface modification of this or these objects is greatly enhanced, as explained in the following in connection with FIGS. 3a and 3b.

The working gas pressure at the inlet of the ultrasonic high intensity and high power acoustic wave generators (101) may be optimized so that high acoustic pressure can be generated. It is preferably between 1.9 and 5 bar or between 2.5 to 4 bar and will typically depend on the type generator used. The gas pressure at the outlet of the high-power gas-jet generators is lower than that at the inlet, and can be practically nearly equal to the gas pressure for the surface modification.

The air-pressure required for operation of gas-jet high-intensity and high-power ultrasonic generators is at least over 1.9 bar for operation under normal conditions and the pressure required for optimal operation providing stable generation of ultrasound with a SPL over 140 dB at 10 cm from the generator orifice is 2.5 to 4 bar depending on a generator type.

The one or more plasma sources (106) may be any plasma source suitable for surface modification of at least one object, e.g. such sources as explained earlier and in the following and/or combinations or such sources e.g. using one or more gases, as explained earlier, in creating the plasma. The plasma source(s) (106) can be chosen among any existing ones (both low and high pressure plasmas), and more specifically may be e.g. direct current plasmas, capacitively coupled plasmas, pulsed plasmas, magnetron plasmas, electron cyclotron resonance plasmas, inductively coupled plasmas, helicon plasmas, helical resonator plasmas, microwave plasmas, DBDs, SDs, plasma torches such as arc plasma torches, cold plasma torches, APPJs, pencil like torches, barrier torches, arc plasma torches, microwave torches, gliding arc, corona discharge, and microplasmas.

The gas pressure for the surface modification is preferably higher than 0.4 bar and may be around atmospheric pressure or more, so that the acoustic energy can be delivered efficiently. One the other hand, it is easier to generate plasmas at lower pressures. Therefore, the gas pressure for the surface modification is preferably more than 0.4 bar and less than the pressure at the inlet of the high-power gas-jet generators. More preferable plasma source may be DBDs, SDs, plasma torches such as arc plasma torches, cold plasma torches, APPJs, pencil like torches, barrier torches, microwave torches, gliding arc, corona discharge, and microplasmas, which can be operated at the pressures mentioned above.

The one or more ultrasonic high intensity and high power acoustic wave generator (101) is a gas-jet acoustic wave generator and may e.g. be one or more Hartmann type gas-jet generators, one or more Levavasseur type gas-jet generators, etc. or combinations thereof and as explained in the following and as shown in FIGS. 9-12.

The use of a gas-jet acoustic wave generator has advantages like described earlier in terms of acoustic power, high intensity, acoustic impedance, etc.

If more than a single ultrasonic and high intensity and high power acoustic wave generator is used they need not be of the same type although they can be.

The surface modification may be e.g. surface cleaning, etching, ashing, surface activation/inactivation, adhesion improvement, wettability enhancement, printability improvement, hardening, cross-linking, curing, polymer-chain secession, coloration, roughening, preparation of hydrophilic and hydrophobic surfaces, sterilization, thin film deposition, biocompatibility and material synthesis (particle formation at the surface etc.) etc.

In one embodiment, the object to have its surface modified is a food item and steam and plasma is subjected to the food item in order to process the food item. This process will generated chemical radicals and sterilize the food item in a very efficient way.

In some embodiments, the solid object(s) (100) (e.g. metal plates) may be covered (fully or partly) with a layer of a liquid or fluid during the plasma surface modification. The liquid or fluid can be diminished or removed during the surface modification.

Figure 3A:
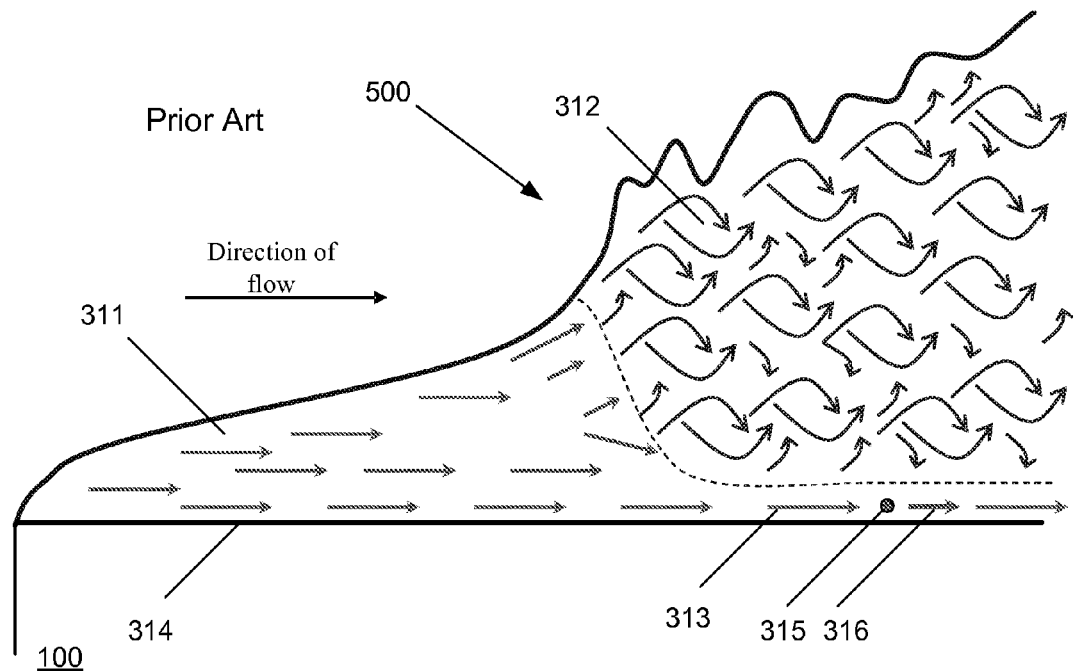
FIG. 3a schematically illustrates a (turbulent) flow over a surface of an object without application of ultrasonic high intensity and high power acoustic waves.

FIG. 3a schematically illustrates a (turbulent) flow over a surface of an object without application of ultrasonic high intensity and high power acoustic waves.

Shown is a surface (314) of a solid object (100) to have (at least a part of) its surface (314) modified by plasma where a gas or a mixture of gases (500) surrounds or contacts the surface (314) thereby preventing the plasma to approach and influence the surface efficiently.

Thermal energy can be transported through gas by conduction as well as by the movement of the gas from one region to another. This process of heat transfer associated with gas movement is usually referred to as convection. When the gas motion is caused only by buoyancy forces set up by temperature differences, the process is normally referred to as natural or free convection; but if the gas motion is caused by some other mechanism, it is usually referred to as forced convection. With a condition of forced convection, there will be a laminar boundary layer (311) near to the surface (314). The thickness of this layer is a decreasing function of the Reynolds number of the flow, so that at high flow velocities, the thickness of the laminar boundary layer (311) will decrease.

When the flow becomes turbulent the layer are divided into a turbulent boundary layer (312) and a laminar boundary layer (313). For nearly all practically occurring gas flows, the flow regime will be turbulent in the entirety of the streaming volume, except for the laminar boundary layer (313) covering the surface (314) wherein the flow regime is laminar. Considering a gas molecule or a particle (315) in the laminar boundary layer (313), the velocity (316) will be substantially parallel to the surface (314) and equal to the velocity of the laminar boundary layer (313). Heat transport across the laminar boundary layer will be by conduction or radiation, due to the nature of laminar flow.

Furthermore, mass transport across the laminar boundary layer will be solely by diffusion. The presence of the laminar boundary layer (313) does not provide optimal or efficient increased mass transport. Any mass transport across the boundary layer will be solely by diffusion, and therefore often be the final limiting factor in an overall mass transport.

The principal impediment to the transfer or transmission of energy and/or mass from a gas to a solid surface is the boundary layer of the gas, which adheres to the solid surface. Even when the motion of the gas is fully turbulent, the laminar boundary layer exists that obstructs mass transport and/or heat transfer. While various methods and types of apparatus have been suggested for overcoming the problem such as by means of driving the gas with sonic waves and vibrating the solid object (100) with external vibration generators, these methods while being effective to some extent, are inherently limited in their ability to generate an effective minimization of the laminar boundary layer and at the same time covering an area large enough to make the method efficient.

Figure 3B:
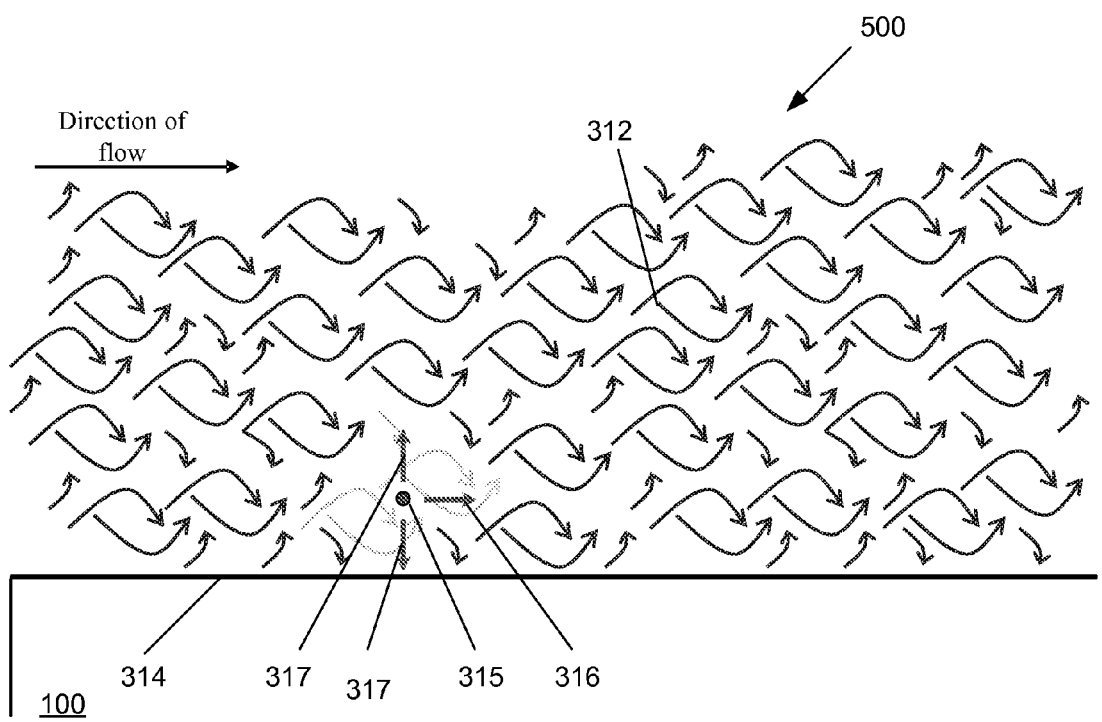
FIG. 3b schematically illustrates a flow over a surface of an object, where the effect of applying ultrasonic high intensity and high power acoustic waves to/in air/gas surrounding, or contacting a surface of an object.

FIG. 3b schematically illustrates a flow over a surface of an object, where the effect of applying high intensity and high power ultrasonic acoustic waves to/in air/gas (500) surrounding or contacting a surface of an object is illustrated.

More specifically, FIG. 3b illustrates the conditions when the surface (314) of a solid object (100) is applied with high intensity and high power ultrasonic acoustic waves by a gas-jet acoustic wave generator (not shown; see e.g. 101 in other Figures). Again consider a gas molecule/particle (315) in the laminar layer; the velocity (316) will be substantially parallel to the surface (314) and equal to the velocity of the laminar layer prior applying ultrasound. In the direction of the emitted sound field to the surface (314) in FIG. 3b, the oscillating velocity of the molecule (315) has been increased significantly as indicated by arrows (317). As an example, a maximum velocity of v=4.5 m/sec and a displacement of +/−32 μm can be achieved where the frequency is f=22 kHz and the sound pressure level=160 dB. The corresponding (vertical) displacement in FIG. 3a is substantially zero since the molecule follows the laminar air stream along the surface. As a result, the acoustic waves will establish a forced heat flow and/or mass transport from the surface to surrounding gas/air (500) by increasing the conduction by minimizing the laminar boundary layer. The sound pressure level is in one embodiment substantially 140 dB or larger. Furthermore, the sound pressure level may be selected within the range of approximately 140-160 dB. The sound pressure level may be above substantially 150 dB, above substantially 160 dB, above substantially 170 dB, above substantially 180 dB, above substantially 190 dB or above substantially 200 dB.

The thinning or destruction of the laminar boundary layer has the effect that heat transfer and mass transport from the surface (314) to the surrounding or contacting gas (500) greatly is increased, as the presence or the reduced size of the laminar boundary layer no longer will hind heat transfer and/or mass transport to the surface of the solid object(s) (100) being subjected to plasma surface modification, i.e. the plasma will more efficiently influence the surface of the object.

Various embodiments are described in connection with the following figures.

Figure 4:
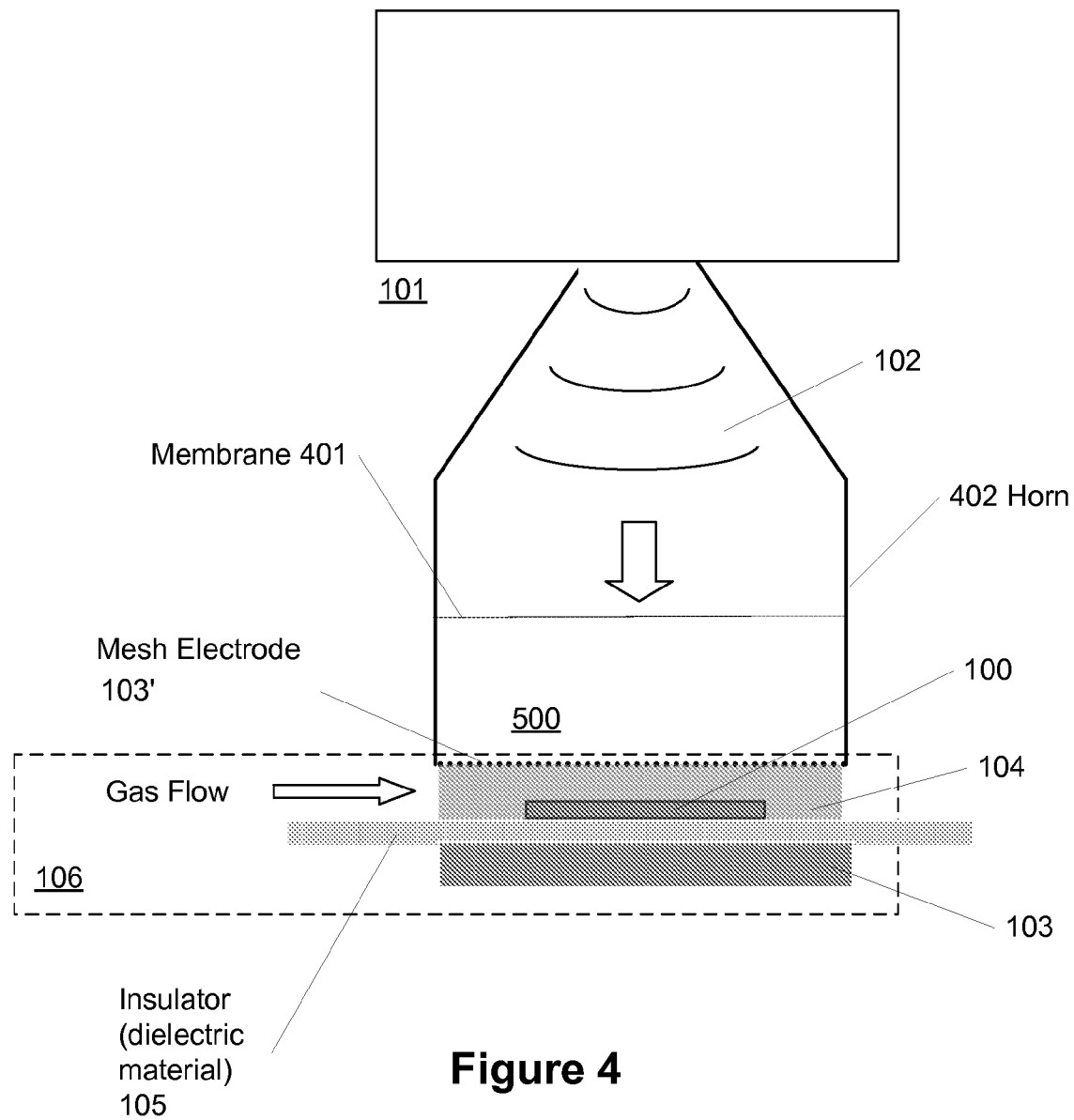
FIG. 4 schematically illustrates one embodiment of an enhanced plasma surface modification apparatus.

FIG. 4 schematically illustrates one embodiment of an enhanced plasma surface modification apparatus.

Shown is at least one ultrasonic high intensity and high power acoustic wave is gas-jet generator (101) generating high intensity and high power ultrasonic acoustic waves (102) propagating towards and reaching a surface of at least one object (100) to be subjected to plasma surface modification.

The at least one object (100) to have its surface properties changed is immersed in or influenced by plasma (104) created by a plasma source (106) using the shown gas flow, the shown electrodes (103; 103'), and an insulator or dielectric material (105) e.g. as explained in connection with FIG. 1. The particular shown plasma source (106) is of the DBD type but could be of another type.

The at least one object (100) is in contact or surrounded by a gas or a gas mixture (500) that, even when turbulent, would comprise a laminar boundary layer or a non-reduced laminar boundary layer as shown and explained in connection with FIG. 3a when ultrasonic high intensity and high power acoustic waves (102) is not applied by a gas-jet generator (101).

The insulator or dielectric material (105) may e.g. comprise $Al_2O_3$ or in general material having a dielectric property or any kind of insulators such as ceramics, polymers and glasses. Ceramics and glasses are more durable against plasma since they have relatively high temperature resistance. They are often preferred, since they typically have high dielectric constants and thus plasma can be generated and sustained at lower AC voltages.

Further shown is a horn or the like (402) or sound guiding or directing means that ensures that the sound intensity and power is contained and focused towards the plasma/object.

In one embodiment, a membrane (401) or similar is located between the high intensity and high power ultrasonic acoustic wave generator (102) and the plasma. This enables control of the gas environment for the plasma generation process so that only the received gas flow is used in creating the plasma. This may be useful for gas driven generators (102) so that the gas from such generators do not interfere with the gas mix used for plasma creation. Other embodiments may exclude the membrane (401). The membrane (401) is preferably relatively thin and relatively transparent to ultrasound. The thickness, size, and/or shape of the membrane (401) and tension applied to it may be optimized for decreasing a loss of ultrasound.

In some embodiment, the membrane can be dispensed with even though it is not preferred that a mix of the gaseous medium used for generating the high intensity and high power ultrasonic acoustic waves and the gas(es) used for creating the plasma occurs. This can be achieved by having a high intensity and high power acoustic wave generator where the generated acoustic waves propagates generally in another direction than the general direction of the gaseous medium after exiting the acoustic wave generator.

Figure 12:
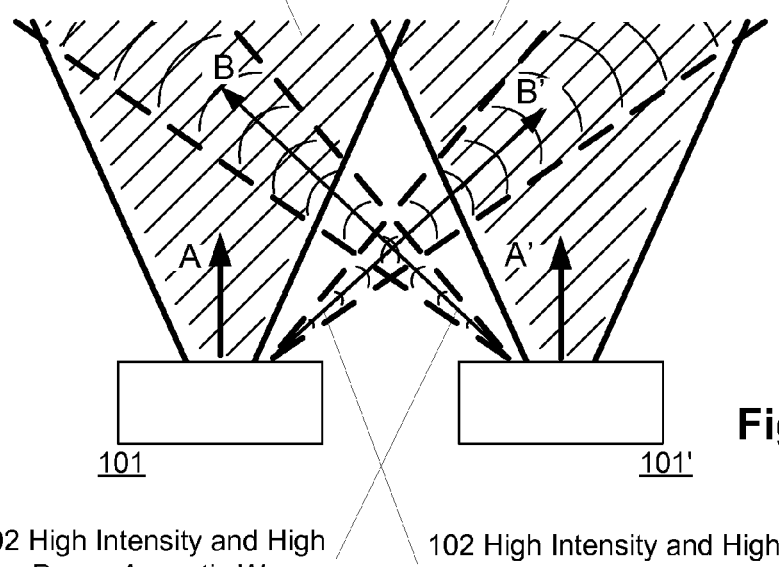
FIG. 12 schematically illustrates an embodiment of a high intensity and high power acoustic generator comprising two generators.

In FIG. 12 is shown two such generators where the general direction of the generated acoustic waves are at an angle to the general direction of the gaseous medium after exit from the generator.

Generators can be designed so that the two directions are about opposite. For instance, stem-jet Hartmann generators radiating ultrasound in the so-called high-frequency regime allow such "natural" spatial separation of the ultrasound field and the outgoing gas flow (see e.g. Y. Y. Borisov, Acoustic gas-jet generators of Hartmann type, in L. D. Rozenberg (ed.) Sources of High-Intensity Ultrasound (New York: Plenum: 1969) part I.). Such generators can be very useful in avoiding the use of a membrane as the gaseous medium may directed away from the plasma and the object that the plasma is to surface modify. In this way, no gas(es) used for generating the acoustic waves will influence the plasma gas(es). It is to be understood that even in such an arrangement a membrane may still be useful (although it may be of a different design) since it can contain the gas(es) used for creating the plasma contained so they do not diffuse into the surrounding environment, which may be useful since some have a significant cost.

Any kinds of membranes can be used, as long as there is neither significant loss of ultrasound nor significant gas leakage. As long as they can form thin films, their materials can be chosen from any thermoplastic and thermoset polymers such as polyesters, polyethylene terephthalate, polyolefins (low density (LD) polyethylene (PE), high density (HD) PE, ultrahigh density PE, ultrahigh molecular weight PE, polypropylene, poly(vinyl chloride), poly(vinylidene chloride), polystyrene, polyimide, polyamide, poly(vinyl vinyl ether), polyisobutylene, polycarbonate, polystyrene, polyurethane, poly(vinyl acetate), poly-acrylonitrile, natural and synthetic rubbers, polymer alloys, copolymers, and their laminates. They can be coated with organic and/or inorganic materials using any existing techniques. Among them, lower density materials such as PE can be used. Furthermore, a metal foil may be used as a membrane. Other examples are metal coated (or material coated with inorganic material) or laminated polymer membranes.

As an alternative, the membrane may comprise or consist of Aerogel.

In one embodiment, the electrode located between the plasma (104) and the generator (101) is a mesh type of electrode (103') or another type of perforated electrode. This enables the generated ultrasound to virtually pass unhindered to the object(s) (100) without loosing a significant amount of energy whereby as much energy as possible is present for influencing the laminar sub-layer around the object(s) (100). Other embodiments may exclude the mesh type/perforated electrode (103').

Figure 5:
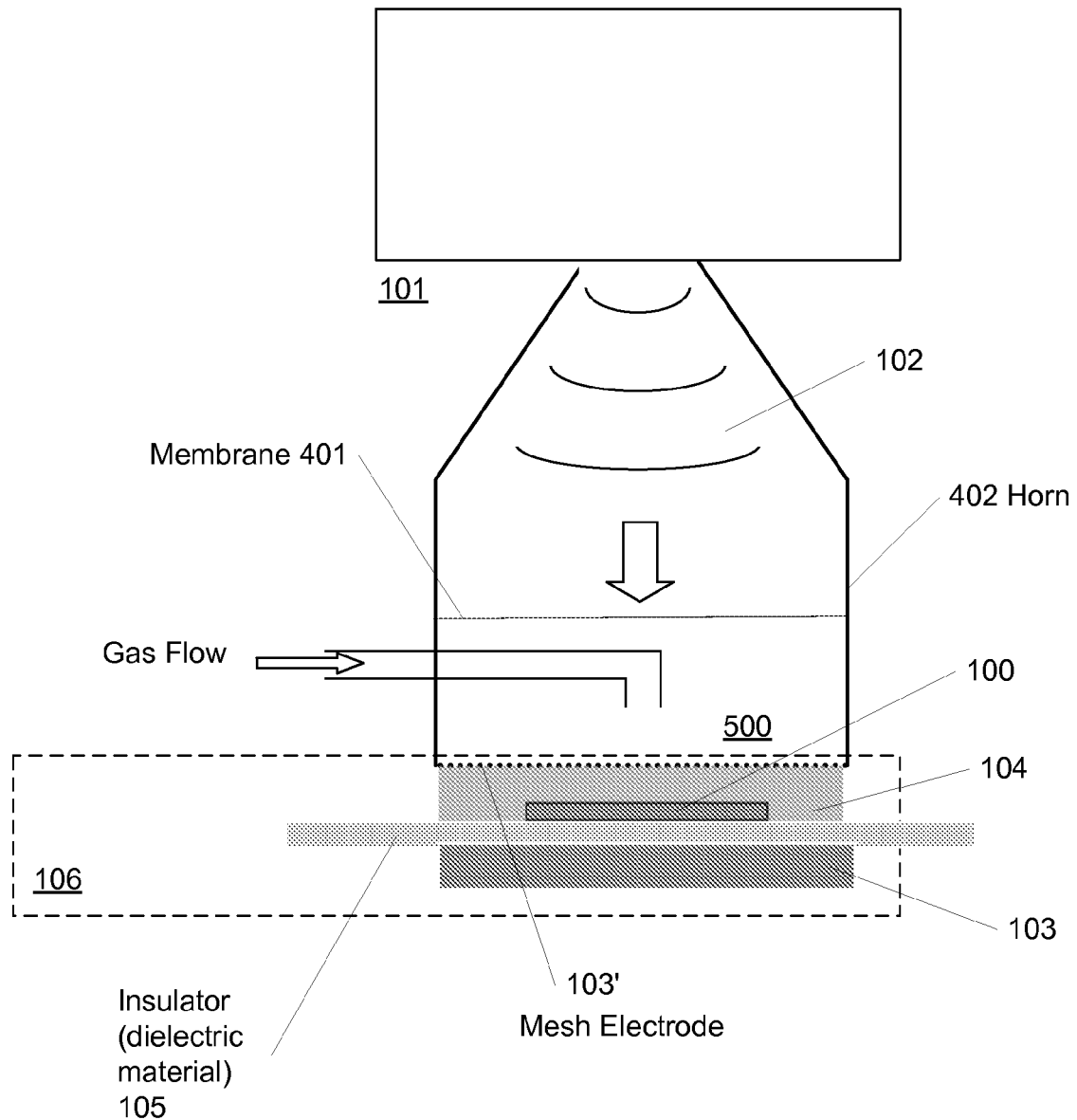
FIG. 5 schematically illustrates an alternative embodiment of an enhanced plasma surface modification apparatus.

The direction of outgoing gas/gas mixture, used for creating the plasma (104), and the ultrasound (102) is quite controllable and the angle between their principal directions may vary. In the shown embodiment, the angle is about 90°. But the angle may in principal be any angle. In FIG. 5 for example, the angle is about 0°.

The gas or gas mixture used for creating the plasma (104) may also be used for driving the gas-jet acoustic generator(s) (101). The plasma (104) may be generated before, in or after the acoustic generator (101).

FIG. 5 schematically illustrates an alternative embodiment of an enhanced plasma surface modification apparatus. This embodiment corresponds to the embodiment shown and explained in connection with FIG. 4 except that the gas for the plasma is not fed from the side but rather from the same direction as the high intensity and high power ultrasonic acoustic waves (102).

Figure 6:
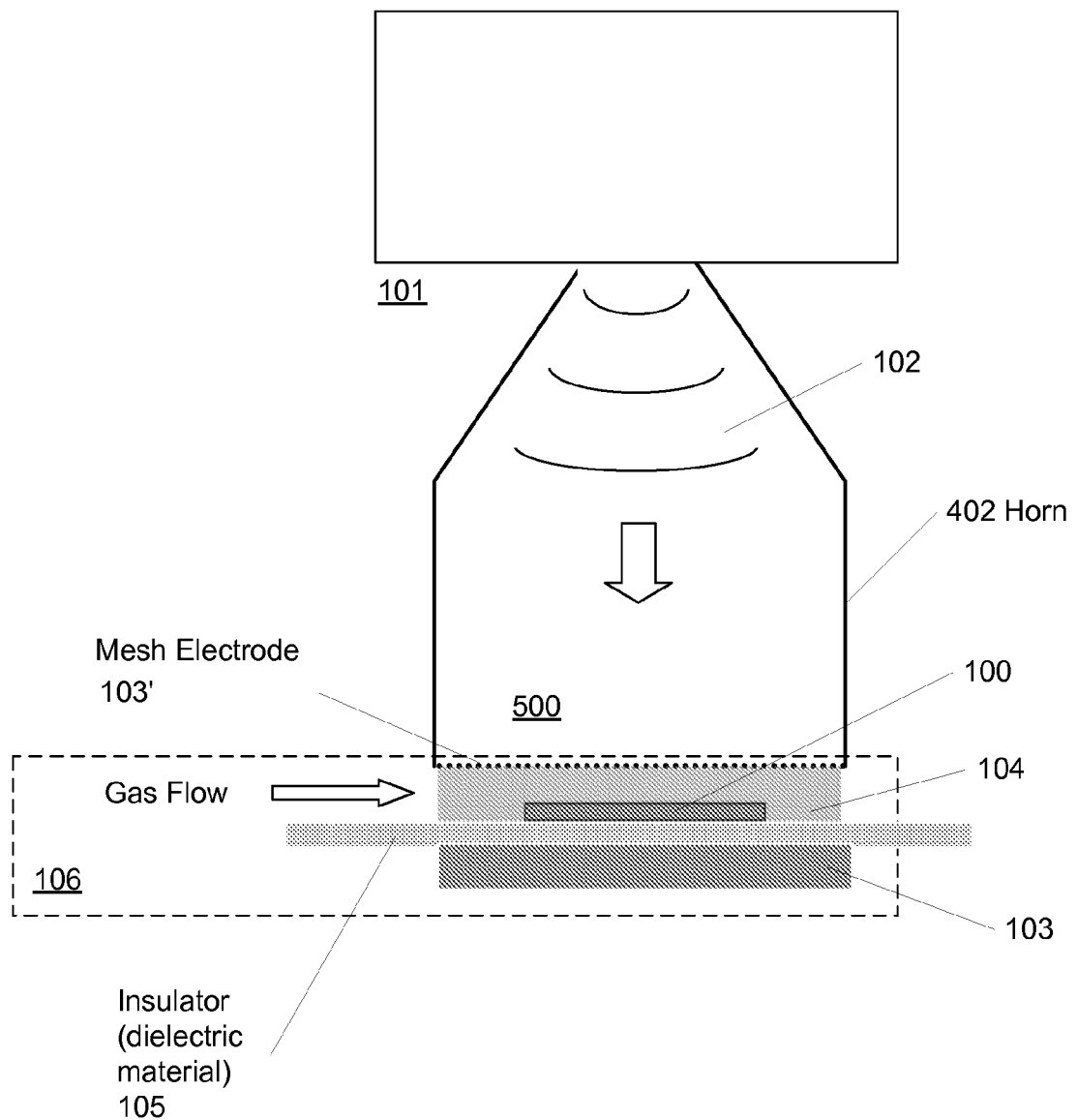
FIG. 6 schematically illustrates an alternative embodiment of an enhanced plasma surface modification apparatus.

FIG. 6 schematically illustrates an alternative embodiment of an enhanced plasma surface modification apparatus. This embodiment corresponds to the embodiment shown and explained in connection with FIG. 4 except that it does not comprise a membrane. Such an embodiment is suitable for ambient or normal air plasma. In such an embodiment without a membrane, a high speed air flow used for the generation of high intensity and high power ultrasound can also be used as a process gas for the plasma.

Figure 7:
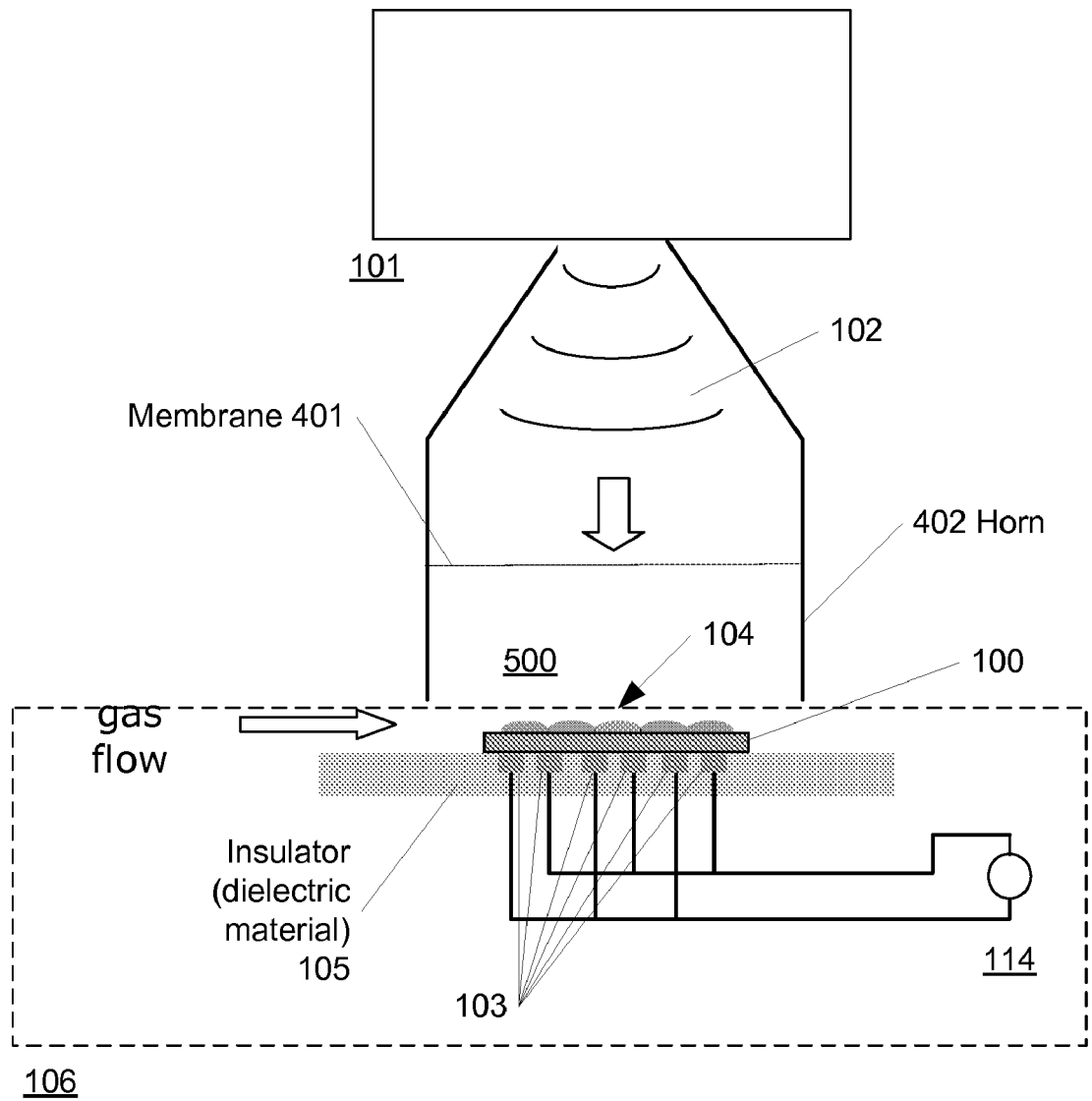
FIG. 7 schematically illustrates an embodiment of an enhanced plasma surface modification apparatus where the plasma source is a surface discharge (SD) plasma source.

FIG. 7 schematically illustrates an embodiment of an enhanced plasma surface modification apparatus where the plasma source is a surface discharge (SD) plasma source. The shown embodiment corresponds to the embodiment shown and explained in connection with FIG. 4 except that instead of a DBD plasma source it comprises a surface discharge (SD) plasma source (106) comprising a single insulator or dielectric material (105) and a number of electrodes (103) embedded in the insulator or the dielectric material (105). The shown SD plasma source is the so-called comprises a so-called CDSD discharge element. Alternatively, it could comprise a SPCP discharge element or by of another type of SD plasma source. As an alternative to the gas flow being received from the side, it could be supplied in the direction of the ultrasonic high intensity and high power acoustic waves e.g. as shown in FIG. 5 or in another way.

Figure 8:
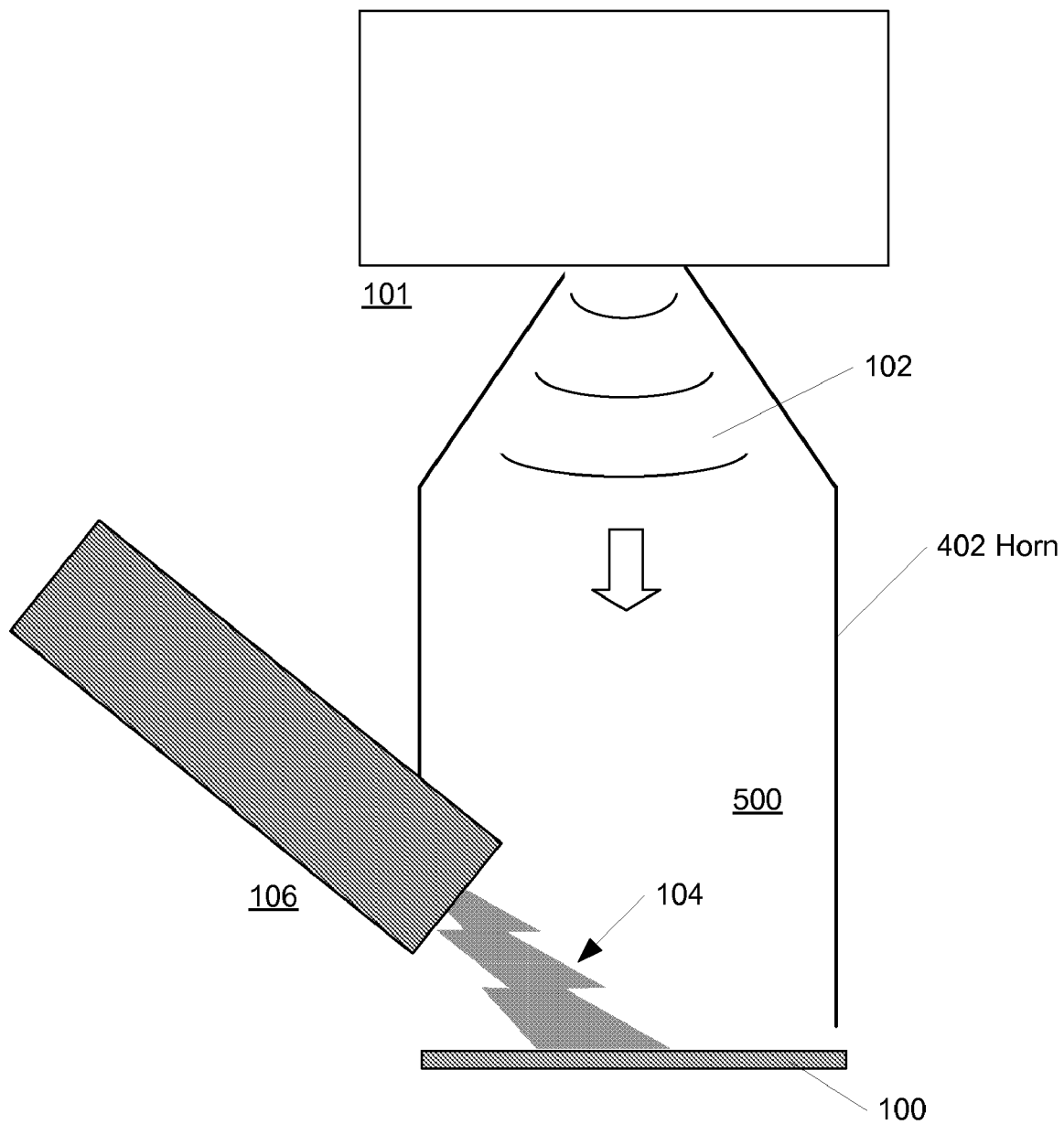
FIG. 8 schematically illustrates an embodiment of an enhanced plasma surface modification apparatus where the plasma source is a torch plasma source e.g. a gliding arc plasma source.

FIG. 8 schematically illustrates an embodiment of an enhanced plasma surface modification apparatus where the plasma source is a torch plasma source e.g. a gliding arc plasma source. The shown embodiment corresponds to the embodiment shown and explained in connection with FIG. 4 except that instead of a DBD plasma source it comprises a torch plasma source e.g. a gliding arc plasma source.

The torch plasma source could e.g. be a barrier torch design or cold plasma torch design as well-known in the art.

Figure 9:
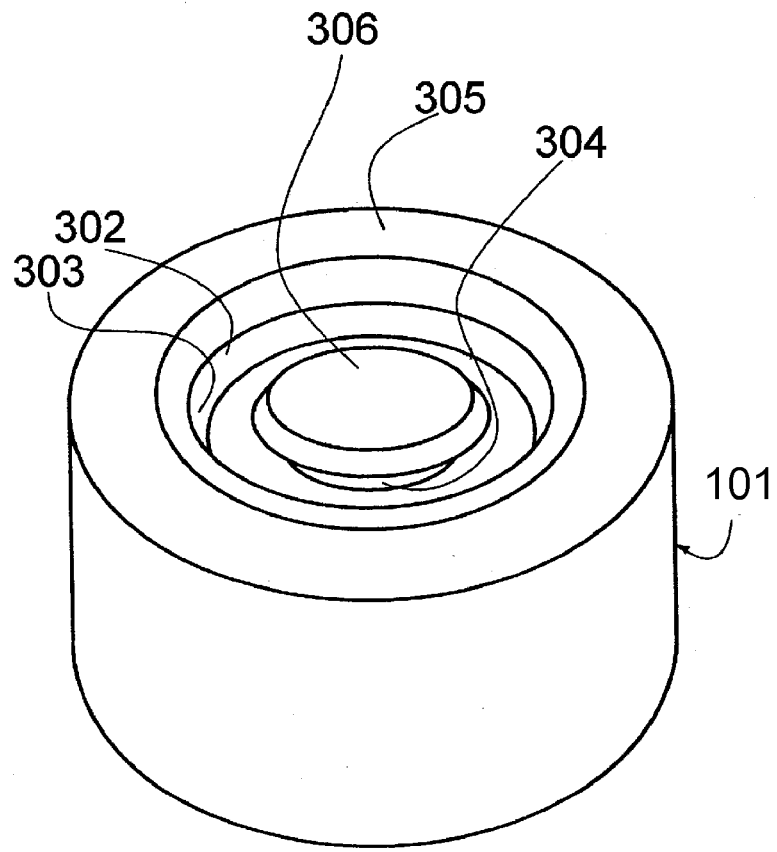
FIG. 9 schematically illustrates an embodiment of a high intensity and high power gas-jet acoustic wave generator wherein a converging supersonic gas jet outgoing a ring-shaped nozzle and braking in a mushroom resonator has the form of a disk (i.e. the so-called disk-jet Hartmann ultrasound generator)

FIG. 9 schematically illustrates an embodiment of a high intensity and high power acoustic wave gas-jet generator in the form of a disk-shaped disk jet (i.e. a disk-jet Hartmann ultrasound generator). Shown is an embodiment of a high intensity ultrasound generator (101), in this example a so-called disk-jet. The generator (101) comprises a generally annular outer part (305) and a generally cylindrical inner part (306), in which an annular cavity (304) is recessed. Through an annular gas passage (303) gases may be diffused to the annular opening (302) from which it may be conveyed to the cavity (304). The outer part (305) may be adjustable in relation to the inner part (306), e.g. by providing a thread or another adjusting device (not shown) in the bottom of the outer part (305), which further may comprise fastening means (not shown) for locking the outer part (305) in relation to the inner part (306), when the desired interval there between has been obtained. Such an ultrasound device may generate a frequency of about 22 kHz at a gas pressure of 4 atmospheres. The molecules of the gas are thus able to migrate up to 33 μm about 22,000 times per second at a velocity of 4.5 m/s. These values are merely included to give an idea of the size and proportions of the ultrasound device and by no means limit of the shown embodiment.

Figure 10:
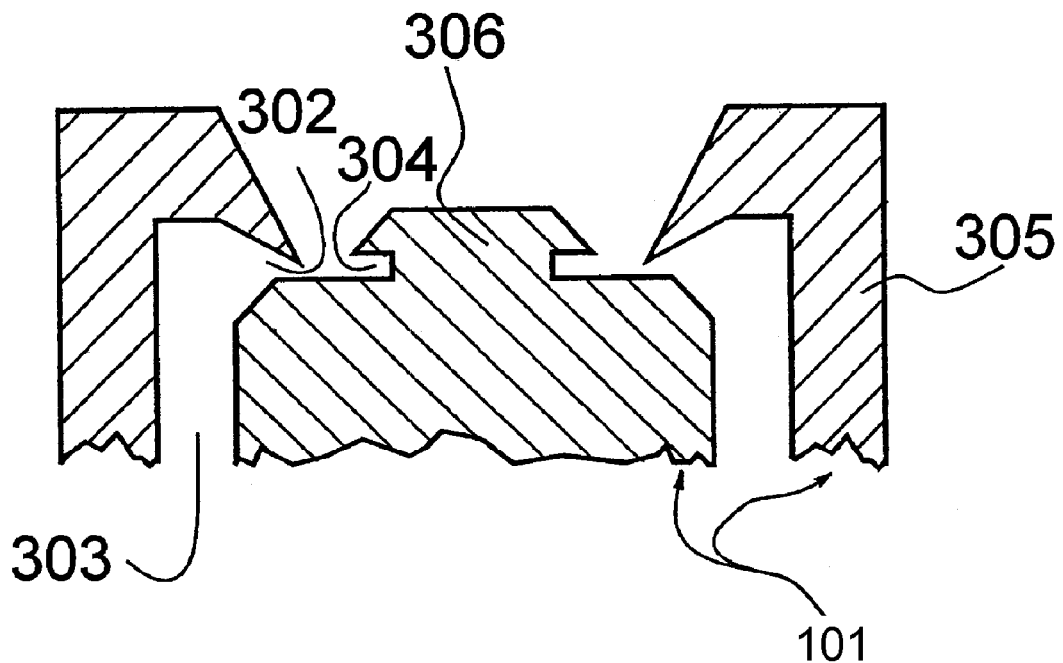
FIG. 10 is a sectional view along the diameter of the high intensity and high power acoustic wave generator (101) in FIG. 9 illustrating the shape of an opening (302), a gas passage (303) and a cavity (304) more clearly.

FIG. 10 is a sectional view along the diameter of the high intensity and high power acoustic wave generator (101) in FIG. 9 illustrating the shape of an opening (302), a gas passage (303) and a cavity (304) more clearly. As mentioned in connection with FIG. 9 the opening (302) is generally annular.

The gas passage (303) and the opening (302) are defined by the substantially annular outer part (305) and the substantially cylindrical inner part (306) arranged therein. The gas jet discharged from the opening (302) hits the substantially circumferential cavity (304) formed in the inner part (306), and then exits the high intensity ultrasound generator (101). As previously mentioned the outer part (305) defines the exterior of the gas passage (303) and is further beveled at an angle of about 30° along the outer surface of its inner circumference forming the opening of the high intensity ultrasound generator, wherefrom the gas jet may expand when diffused. Jointly with a corresponding beveling of about 60° on the inner surface of the inner circumference, the above beveling forms an acute-angled circumferential edge defining the opening (302) externally. The inner part (306) has a beveling of about 45° in its outer circumference facing the opening and internally defining the opening (302). The outer part (305) may be adjusted in relation to the inner part (306), whereby the pressure of the gas jet hitting the cavity (304) may be adjusted. The top of the inner part (306), in which the cavity (304) is recessed, is also beveled at an angle of about 45° to allow the oscillating gas jet to expand at the opening of the high intensity ultrasound generator.

Figure 11:
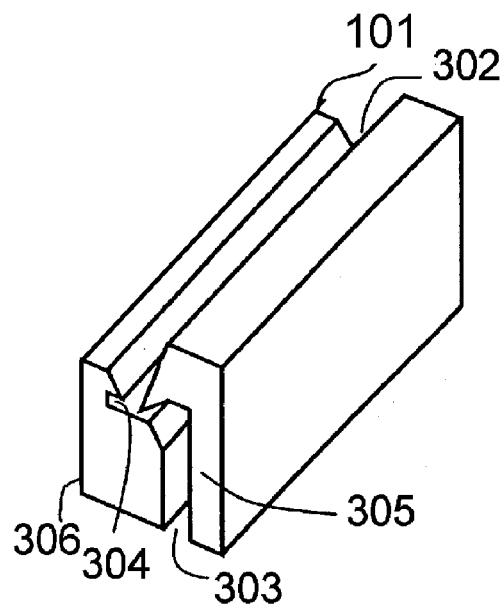
FIG. 11 schematically illustrates another embodiment of a high intensity and high power acoustic generator in form of an elongated body.

FIG. 11 schematically illustrates another embodiment of a high intensity and high power acoustic wave generator in form of an elongated body. Shown is a high intensity and high power gas-jet acoustic wave generator (101) comprising an elongated substantially rail-shaped body, where the body is functionally equivalent with the embodiments shown in FIGS. 9 and 10. In this embodiment the outer part comprises one rail-shaped portion (305), which jointly with a rail-shaped other part (306) forms an ultrasound device (101). A gas passage (303) is provided between the rail-shaped portion (305) and the rail-shaped other part (306). The gas passage has an opening (302) conveying emitted gas from the gas passage (303) to a cavity (304) provided in the rail-shaped other part (306). One advantage of this embodiment is that a rail-shaped body is able to coat a far larger surface area than a circular body. Another advantage of this embodiment is that the high intensity and high power acoustic wave generator may be made in an extruding process, whereby the cost of materials is reduced.

FIG. 12 schematically illustrates an embodiment of a high intensity and high power acoustic generator comprising two generators. Shown is an example of two gas-jet high intensity and high power acoustic wave generators (101; 101'), a first (101) and a second (101'), where each generator (101; 101') generates high intensity and high power acoustic waves (102) using a gaseous medium (121). The gaseous medium (121) exits each generator (101) in a principal direction schematically indicated by arrow (A; A') in a cone-like shape, as represented by the hatched area, towards one or more solid objects (100) to have its surface modified by plasma.

The high intensity and high power acoustic waves (102) generated by the first generator (101) propagate in a principal direction as schematically indicated by arrows (B) that is different than the general direction of the gaseous medium (A) from the first generator (101) due to the design of the high power acoustic wave generator (101).

The high intensity and high power acoustic waves (102) generated by the second generator (101') propagate in a general direction as schematically indicated by arrow (B').

One example of a high intensity and high power acoustic wave generator operating in a way like this is shown and explained in connection with FIG. 11. This design generates high intensity and high power acoustic waves in a substantial line (seen from above), whereas the design of FIGS. 9 and 10 generates waves in a substantially circular way.

The first (101) and the second high power acoustic wave generator (101) are located in relation to each other so that at least a part of the generated high intensity and high power acoustic waves (102) from the second acoustic wave generator (101') has a general direction (B') that is directed towards at least a part of the gaseous medium (121) from the first acoustic wave generator (101) and that at least a part of the generated high intensity and high power acoustic waves (102) from the first acoustic wave generator (101) has a general direction (B) that is directed towards at least a part of the gaseous medium (121) from the second acoustic wave generator (101').

By directing high intensity and high power acoustic waves generated by the second generator (101) directly towards the gaseous medium (121) from the first generator (101), energy is supplied in as a direct way as possible so that it directly influences the gaseous medium (121) thereby increasing the efficiency or turbulence of the gaseous medium.

This gives a very compact and efficient setup as the gaseous medium of each generator is enhanced by the high intensity and high power acoustic waves of another generator using a total of only two generators.

If only a single generator (101) was used, the difference between the general directions of the high intensity and high power acoustic waves (B or B') and the general direction of the gaseous medium (A or A') for a single generator (101) would cause a loss in efficiency since the acoustic waves do not coincide with the gaseous medium (121).

The location of the generators (101; 101') in relation to each other may vary. One example is e.g. where the two generators are facing each other displaced or shifted but where the high intensity and high power acoustic waves still directly influences the gaseous medium of the other generator.

In the figure, the shown sizes, directions, etc. of the cones (121; 102) do not relate to any specific physical properties like acoustic wave intensity, etc. but merely serve for illustrational purposes. The intensities and/or power of the two generators (101) may be equal or different (with either one being greater than the other is). Furthermore, the shapes, sizes, and directions may vary from application to application.

The specific location of one of the generator (101; 101') may also vary in relation to the other generator and may e.g. be placed above or higher than and/or e.g. facing, the other generator (101); as long as the acoustic waves (102) of one generator (101) directly influences the gaseous medium (121) of the other generator (101) and vice versa.

Although this particular example shows two generators it is to be understood that a given arrangement may comprises additional generators.

The gaseous medium (102) may in general be any gaseous medium. In one embodiment the gaseous medium (102) is steam. In an alternative embodiment the gaseous medium (102) comprises one or more gases used for creating the plasma to modify the surface of the solid object.

It is to be noted, that one or more of the acoustic generators shown in connection with FIG. 12 or any other Figure could comprise one or more reflectors e.g. of generally parabolic or elliptical shape for directing the acoustic energy to a preferred region or spot.

It should be emphasized that the term "comprises/comprising" when used in is this specification is taken to specify the presence of stated features, integers, steps or components but does not preclude the presence or addition of one or more other features, integers, steps, components and/or groups thereof.

In the claims, any reference signs placed between parentheses shall not be constructed as limiting the claim. The word "comprising" does not exclude the presence of elements or steps other than those listed in a claim. The word "a" or "an" preceding an element does not exclude the presence of a plurality of such elements.

The invention can be implemented by means of hardware comprising several distinct elements, and by means of a suitably programmed computer or processor. In the system and device claims enumerating several means, several of these means can be embodied by one and the same item of hardware. The mere fact that certain measures are recited in mutually different dependent claims does not indicate that a combination of these measures cannot be used to advantage.

The invention claimed is:

1. A method of plasma surface modification of a solid object comprising:
    creating plasma by at least one plasma source, and
    application of the plasma to at least a part of a surface of the solid object, wherein the method further comprises:
    generating ultrasonic high intensity and high power acoustic waves by at least one ultrasonic high intensity and high power gas-jet acoustic wave generator, where said ultrasonic high intensity and high power acoustic waves are directed to propagate towards said surface of the object so that a laminar boundary layer of a gas or a mixture of gases in contact with said solid object is removed or minimized for at least a part of said surface, and where a sound pressure level of said generated ultrasonic high intensity and high power acoustic waves is at least substantially 140 dB and where an acoustic power of said generated ultrasonic high intensity and high power acoustic waves is at least substantially 100 W.

2. A method according to claim 1, wherein said sound pressure level of said generated ultrasonic high intensity and high power acoustic waves is
    at least substantially 150 dB,
    at least substantially 160 dB,
    at least substantially 170 dB,
    at least substantially 180 dB,
    at least substantially 190 dB, or
    at least substantially 200 dB.

3. A method according to claim 1, wherein said acoustic power of said generated ultrasonic high intensity and high power acoustic waves is
    at least substantially 200 W,
    at least substantially 300 W,
    at least substantially 400 W,
    about 400 W,
    greater than substantially 400 W,
    at least substantially 500 W,
    at least substantially 1 kW, or
    selected from about 1-2 kW.

4. A method according to claim 1, wherein said plasma source comprises at least one source selected from a group of: a dielectric barrier discharge (DBD) plasma source, a surface discharge (SD) plasma source, a volume discharge (VD) plasma source, a plasma torch source, an arc plasma torch, a gliding arc plasma torch, a cold plasma torch, a pencil-like torch, a direct current plasma source, a capacitively coupled plasma source, a pulsed plasma source, a magnetron plasma source, an electron cyclotron resonance plasma source, an inductively coupled plasma source, a helicon plasma source, a helical resonator plasma source, a microwave plasma source, an atmospheric pressure plasma jet (APPJ) source, a barrier torch, an arc microwave torch, a corona discharge plasma source, a micro-plasma source, a low pressure plasma source, and a high pressure plasma source.

5. A method according to claim 1, wherein a working gas pressure at an inlet of said at least one ultrasonic high intensity and high power gas-jet acoustic wave generator is between approximately 1.9 and approximately 5 bar.

6. A method according to claim 1, wherein said plasma is created at atmospheric pressure.

7. A method according to claim 1, wherein said plasma source comprises at least one electrode and wherein one electrode of said at least one electrode is a mesh type of electrode.

8. A method according to claim 1, wherein the generated ultrasonic high intensity and high power acoustic waves are propagated towards a membrane so that any gases used by the at least one ultrasonic high intensity and high power acoustic wave generator is not mixed with one or more gases used by said plasma source to create said plasma.

9. A method according to claim 1, wherein the generated ultrasonic high intensity and high power acoustic waves are generated using a gaseous medium and where the acoustic waves are directed towards said surface of the object and wherein said gaseous medium after exit of said at least one ultrasonic high intensity and high power gas jet acoustic wave generator is directed away from said surface of the object.

10. A method according to claim 1, wherein a gas mixture used for creating the plasma is supplied to at least one electrode of the plasma source substantially in a direction that said ultrasonic acoustic waves propagate towards said surface of the object.

11. A method according to claim 1, wherein said at least one ultrasonic high intensity and high power gas-jet acoustic wave generator is selected from the group of:
    a Hartmann type gas-jet generator,
    a Levavasseur type gas-jet generator,
    a generator comprising an outer part and an inner part defining a passage, an opening, and a cavity provided in the inner part, where said ultrasonic high intensity and high power gas-jet acoustic wave generator is adapted to receive a pressurized gas and pass the pressurized gas to said opening, from which the pressurized gas is discharged in a jet towards the cavity,
    a generator of any of the above mentioned types, which includes any type of concentrators or reflectors of acoustic waves.

12. A method according to claim 1, wherein said solid object is food item, and the method further comprises applying steam to the food item so that the food item is subjected to steam and plasma causing a sterilization process of the food item.

13. A method according to claim 1, wherein said generating ultrasonic high intensity and high power acoustic waves comprises:
    generating high intensity and high power acoustic waves by a first acoustic wave generator using a gaseous medium where the gaseous medium, after exit from the first acoustic wave generator, has a first principal direction (A) that is different from a second principal direction (B) of the high intensity and high power acoustic waves generated by the first acoustic wave generator,
    generating high intensity and high power acoustic waves by a second acoustic wave generator,
    where the first and second acoustic wave generators are located in relation to each other so that at least a part of the generated high intensity acoustic waves, being generated by said second acoustic wave generator, is directed towards at least a part of the gaseous medium after exit from said first acoustic wave generator.

14. A method according to claim 1, wherein said plasma surface modification of a solid object is selected from the group of:
    surface activation and/or inactivation,
    adhesion improvement,
    wettability enhancement,
    printability improvement, surface cleaning,
hardening,
cross-linking,
curing,
polymer-chain secession,
coloration,
roughening,
ashing,
etching,
sterilization,
thin film deposition,
material synthesis, and
particle formation at the surface.

15. A solid object having a surface being modified by plasma wherein the solid object have been modified with a method according to claim 1.

16. A system for plasma surface modification of a solid object comprising:
    at least one plasma source adapted to create plasma applied to at least a part of a surface of the solid object, wherein the system further comprises:
    at least one ultrasonic high intensity and high power gas-jet acoustic wave generator adapted to generate ultrasonic high intensity and high power acoustic waves being directed to propagate towards said surface of the solid object so that a laminar boundary layer of a gas or a mixture of gases in contact with said solid object is removed or minimized for at least a part of said surface, and where a sound pressure level of said generated ultrasonic high intensity and high power acoustic waves is at least substantially 140 dB and where an acoustic power of said generated ultrasonic high intensity and high power acoustic waves is at least 100 W.

17. A system according to claim 16, wherein the sound pressure level of said generated ultrasonic high intensity and high power acoustic waves is
    at least substantially 150 dB,
    at least substantially 160 dB,
    at least substantially 170 dB,
    at least substantially 180 dB,
    at least substantially 190 dB, or
    at least substantially 200 dB.

18. A system according to claim 16, wherein said acoustic power of said generated ultrasonic high intensity and high power acoustic waves is
    at least substantially 200 W,
    at least substantially 300 W,
    at least substantially 400 W,
    about 400 W,
    greater than substantially 400 W,
    at least substantially 500 W,
    at least substantially 1 kW, or
    selected from about 1-2 kW.

19. A system according to claim 16, wherein said plasma source comprises at least one source selected from a group of: a dielectric barrier discharge (DBD) plasma source, a surface discharge (SD) plasma source, a volume discharge (VD) plasma source, a plasma torch source, an arc plasma torch, a gliding arc plasma torch, a cold plasma torch, a pencil-like torch, a direct current plasma source, a capacitively coupled plasma source, a pulsed plasma source, a magnetron plasma source, an electron cyclotron resonance plasma source, an inductively coupled plasma source, a helicon plasma source, a helical resonator plasma source, a microwave plasma source, an atmospheric pressure plasma jet (APPJ) source, a barrier torch, an arc microwave torch, a corona discharge plasma source, a micro-plasma source, a low pressure plasma source, and a high pressure plasma source.

20. A system according to claim 16, wherein a working gas pressure at an inlet of said at least one ultrasonic high intensity and high power gas-jet acoustic wave generator is between approximately 1.9 and approximately 5 bar.

21. A system according to claim 16, wherein said plasma is created at atmospheric pressure.

22. A system according to claim 16, wherein said plasma source comprises at least one electrode and wherein one electrode of said at least one electrode is a mesh type of electrode.

23. A system according to claim 16, wherein said system further comprises a membrane and where the system is adapted to propagate the generated ultrasonic high intensity and high power acoustic waves towards the membrane so that any gases used by the at least one ultrasonic high intensity and high power acoustic wave generator is not mixed with one or more gases used by said plasma source to create said plasma.

24. A system according to claim 16, wherein the generated ultrasonic high intensity and high power acoustic waves are generated using a gaseous medium and where the acoustic waves are directed towards said surface of the object and wherein said gaseous medium after exit of said at least one ultrasonic high intensity and high power gas-jet acoustic wave generator is directed away from said surface of the object.

25. A system according to claim 16, said plasma source comprises at lease one electrode and wherein a gas mixture used for creating the plasma is supplied to the at least one electrode substantially in a direction that said ultrasonic acoustic waves propagates towards said surface of the object.

26. A system according to claim 16, wherein said at least one ultrasonic high intensity and high power gas jet acoustic wave generator is selected from the group of:
    a Hartmann type gas-jet generator,
    a Levavasseur type gas-jet generator,
    a generator comprising an outer part and an inner part defining a passage, an opening, and a cavity provided in the inner part, where said ultrasonic high intensity and high power gas-jet acoustic wave generator is adapted to receive a pressurized gas and pass the pressurized gas to said opening, from which the pressurized gas is discharged in a jet towards the cavity,
    a generator of any of the above mentioned types, which includes any type of concentrators or reflectors of acoustic waves.

27. A system according to claim 16, wherein said solid object is food item, and wherein said system further comprises means for applying steam to the food item so that the food item is subjected to steam and plasma causing a sterilization process of the food item.

28. A system according to claim 16, wherein said at least one ultrasonic high intensity and high power gas-jet acoustic wave generator comprises
    a first acoustic wave generator for generating high intensity acoustic waves using a gaseous medium where the gaseous medium after exit from said first acoustic wave generator has a first principal direction (A) that is different from a second principal direction (B) of generated high intensity acoustic waves being generated by said first acoustic wave generator, and
    at least a second acoustic wave generator for generating high intensity acoustic waves,
    where said first and second acoustic wave generators are located in relation to each other so that at least a part of the generated high intensity acoustic waves, being generated by one of said first and second acoustic wave generator, is directed towards at least a part of the gaseous medium after exit from the other of said first and said second acoustic wave generator.

29. A system according to claim 16, wherein said plasma surface modification of a solid object is selected from the group of:
  surface activation and/or inactivation,
  adhesion improvement,
  wettability enhancement,
  printability improvement,
  surface cleaning,
  hardening,
  cross-linking,
  curing,
  polymer-chain secession,
  coloration,
  roughening,
  ashing,
  etching,
  sterilization,
  thin film deposition,
  material synthesis, and
  particle formation at the surface.

* * * * *